(12) United States Patent
Lan et al.

(10) Patent No.: US 8,022,896 B2
(45) Date of Patent: Sep. 20, 2011

(54) ESD PROTECTION FOR MEMS DISPLAY PANELS

(75) Inventors: Je-Hsiung Lan, Cupertino, CA (US); Lixia Zhou, Milpitas, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 1077 days.

(21) Appl. No.: 11/836,045

(22) Filed: Aug. 8, 2007

(65) Prior Publication Data

US 2009/0040136 A1    Feb. 12, 2009

(51) Int. Cl.
*G09G 3/00*    (2006.01)
(52) U.S. Cl. .......................................................... 345/30
(58) Field of Classification Search ........................ None
See application file for complete search history.

(56) References Cited

U.S. PATENT DOCUMENTS

| | | | |
|---|---|---|---|
| 4,425,572 A | 1/1984 | Takafuji et al. | |
| 4,954,789 A | 9/1990 | Sampsell | |
| 5,226,099 A | 7/1993 | Mignardi et al. | |
| 5,367,878 A | 11/1994 | Muntz et al. | |
| 5,578,976 A | 11/1996 | Yao | |
| 5,619,061 A | 4/1997 | Goldsmith et al. | |
| 5,638,946 A | 6/1997 | Zavracky | |
| 5,784,189 A | 7/1998 | Bozler et al. | |
| 5,880,921 A | 3/1999 | Tham et al. | |
| 5,946,176 A * | 8/1999 | Ghoshal | 361/56 |
| 6,040,937 A | 3/2000 | Miles | |
| 6,310,339 B1 | 10/2001 | Hsu et al. | |
| 6,320,145 B1 | 11/2001 | Tai et al. | |
| 6,376,787 B1 | 4/2002 | Martin et al. | |
| 6,529,654 B1 | 3/2003 | Wong et al. | |
| 6,574,033 B1 | 6/2003 | Chui et al. | |
| 6,625,047 B2 | 9/2003 | Coleman, Jr. | |
| 6,674,562 B1 | 1/2004 | Miles et al. | |
| 6,787,438 B1 | 9/2004 | Nelson | |
| 6,972,881 B1 | 12/2005 | Bassetti | |
| 7,034,783 B2 | 4/2006 | Gates et al. | |
| 7,123,216 B1 | 10/2006 | Miles | |
| 7,161,728 B2 | 1/2007 | Sampsell et al. | |
| 7,196,837 B2 | 3/2007 | Sampsell et al. | |
| 7,400,489 B2 | 7/2008 | Van Brocklin et al. | |
| 7,489,228 B2 | 2/2009 | Robert | |
| 2002/0000959 A1 | 1/2002 | Colgan et al. | |

(Continued)

FOREIGN PATENT DOCUMENTS

EP    0 706 164    4/1996

(Continued)

OTHER PUBLICATIONS

ISR and WO for PCT/US08/072011, filed Aug. 1, 2008.

(Continued)

*Primary Examiner* — Richard Hjerpe
*Assistant Examiner* — Carolyn R Edwards
(74) *Attorney, Agent, or Firm* — Knobbe Martens Olson & Bear LLP

(57) ABSTRACT

A MEMS (Microelectromechanical system) device is described. The device includes an array of MEMS elements with addressing lines and MEMS switches configured to selectively connect the addressing lines to a ground or other potential in the event of an over-voltage, such as during an ESD event. The arrangement is particularly advantageous for protecting the array, because the MEMS switches can be formed using substantially the same processing steps which are used to form the array.

42 Claims, 15 Drawing Sheets

U.S. PATENT DOCUMENTS

| | | |
|---|---|---|
| 2002/0018154 A1 | 2/2002 | Yoo et al. |
| 2002/0024711 A1 | 2/2002 | Miles |
| 2002/0050882 A1 | 5/2002 | Hyman et al. |
| 2002/0097133 A1 | 7/2002 | Charvet et al. |
| 2002/0179421 A1 | 12/2002 | Williams et al. |
| 2004/0022044 A1 | 2/2004 | Yasuoka et al. |
| 2004/0223204 A1 | 11/2004 | Mao et al. |
| 2005/0116924 A1 | 6/2005 | Sauvante et al. |
| 2005/0122560 A1 | 6/2005 | Sampsell et al. |
| 2005/0190168 A1 | 9/2005 | Jiang et al. |
| 2005/0286113 A1 | 12/2005 | Miles |
| 2006/0066935 A1 | 3/2006 | Cummings et al. |
| 2006/0066937 A1 | 3/2006 | Chui |
| 2006/0067648 A1 | 3/2006 | Chui et al. |
| 2006/0077504 A1* | 4/2006 | Floyd .......................... 359/237 |
| 2006/0103613 A1 | 5/2006 | Chui |
| 2006/0176072 A1 | 8/2006 | Kim et al. |
| 2006/0214181 A1 | 9/2006 | Lim et al. |
| 2008/0142347 A1 | 6/2008 | Lewis |
| 2009/0086305 A1 | 4/2009 | Chui |

FOREIGN PATENT DOCUMENTS

| | | |
|---|---|---|
| EP | 1 146 533 | 10/2001 |
| EP | 1 343 190 | 9/2003 |
| EP | 1 640 321 | 3/2006 |
| EP | 1 640 960 | 3/2006 |
| GB | 2 429 824 | 3/2007 |
| WO | WO 03/060940 | 7/2003 |

OTHER PUBLICATIONS

IPRP for PCT/US08/072011, dated Nov. 10, 2009.

Miles, MEMS-based interferometric modulator for display applications, Part of the SPIE Conference on Micromachined Devices and Components, vol. 3876, pp. 20-28 (1999).

Miles et al., 5.3: Digital Paper™: Reflective displays using interferometric modulation, SID Digest, vol. XXXI, 2000 pp. 32-35.

Peroulis et al., Low contact resistance series MEMS switches, 2002, pp. 223-226, vol. 1, IEEE MTT-S International Microwave Symposium Digest, New York, NY.

Extended European Search Report dated Dec. 4, 2008 in App. No. 08153422.4.

Extended European Search Report dated Dec. 4, 2008 in App. No. 08153737.5.

* cited by examiner

ESD PROTECTION FOR MEMS DISPLAY PANELS

BACKGROUND

1. Field of the Invention

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Interferometric modulators described below sometimes suffer manufacturing yield loss because of large electric fields which occur during removal of a sacrificial layer during fabrication. Embodiments discussed below include switches which temporarily electrically short sensitive layers so as to prevent the electric fields from developing. The switches are configured to short the sensitive layers during the fabrication steps during which the damaging electric fields develop, and to remain open thereafter. Similarly, testing of an array of interferometric modulators with many row lines and column lines requires many input signals. Embodiments discussed below include switches which temporarily electrically short subsets of rows and/or columns so that fewer input signals may be used. The switches are configured to short the subsets during the testing operation, and to remain open thereafter.

Figure 1:
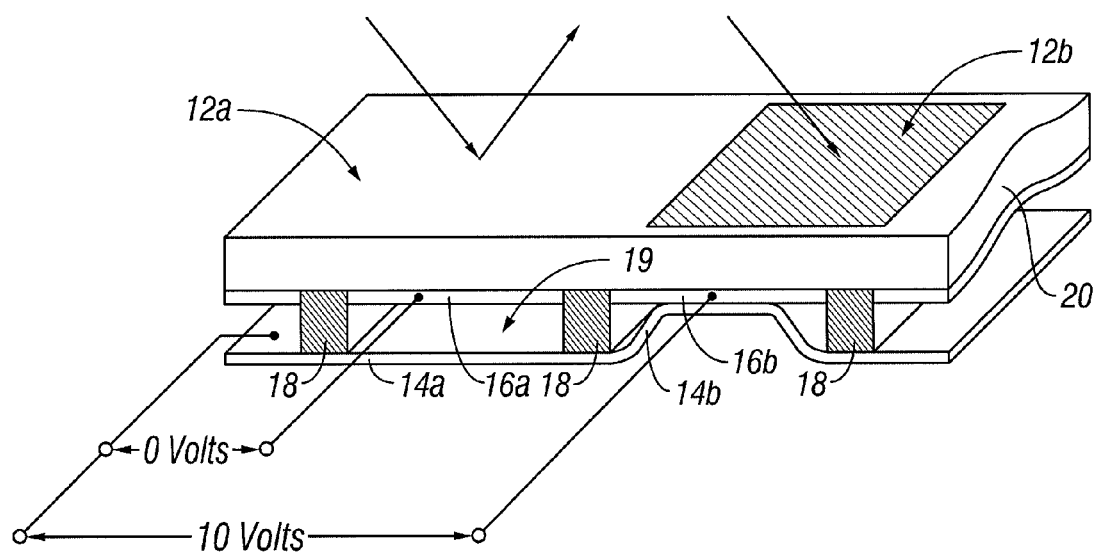
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
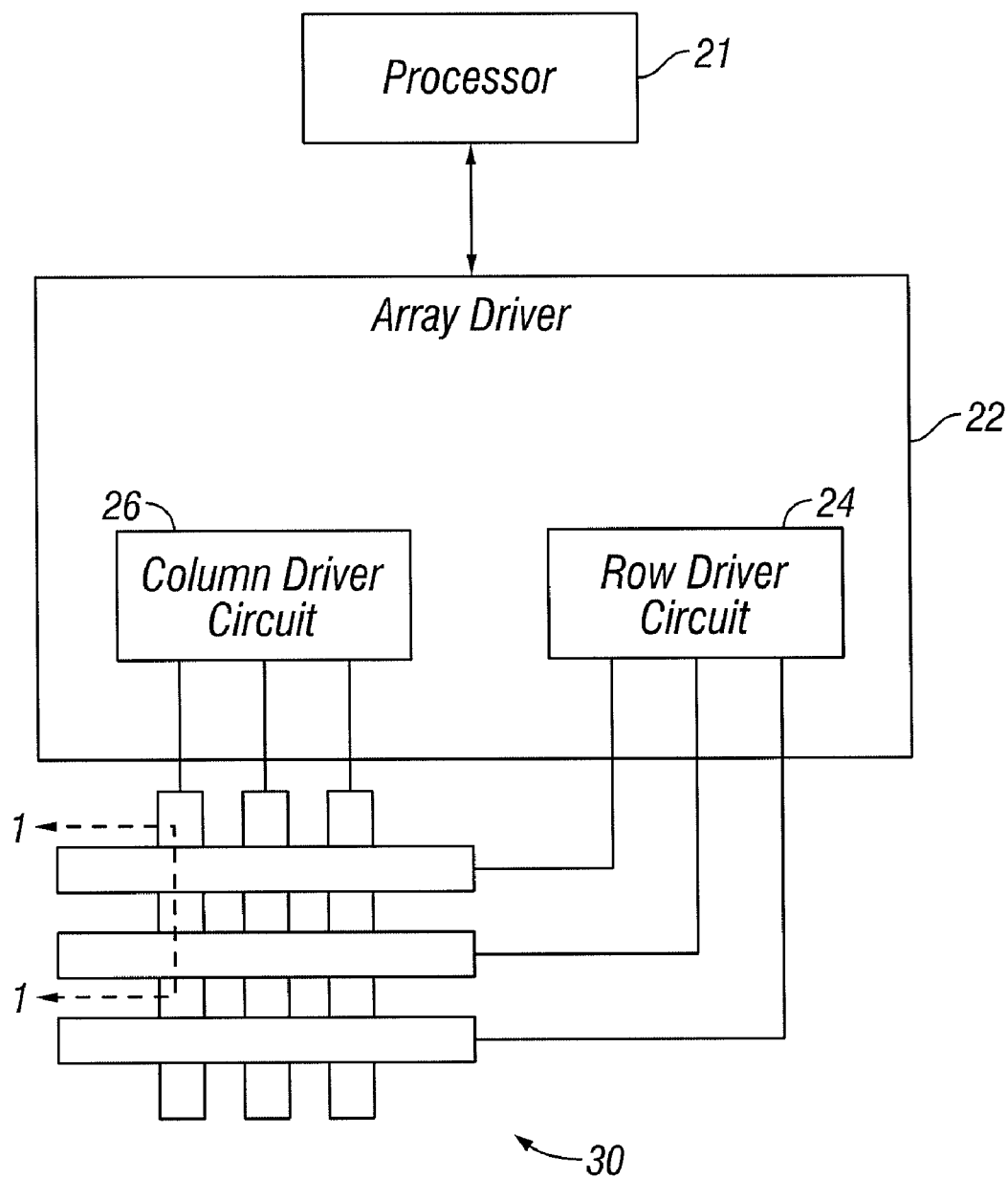
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
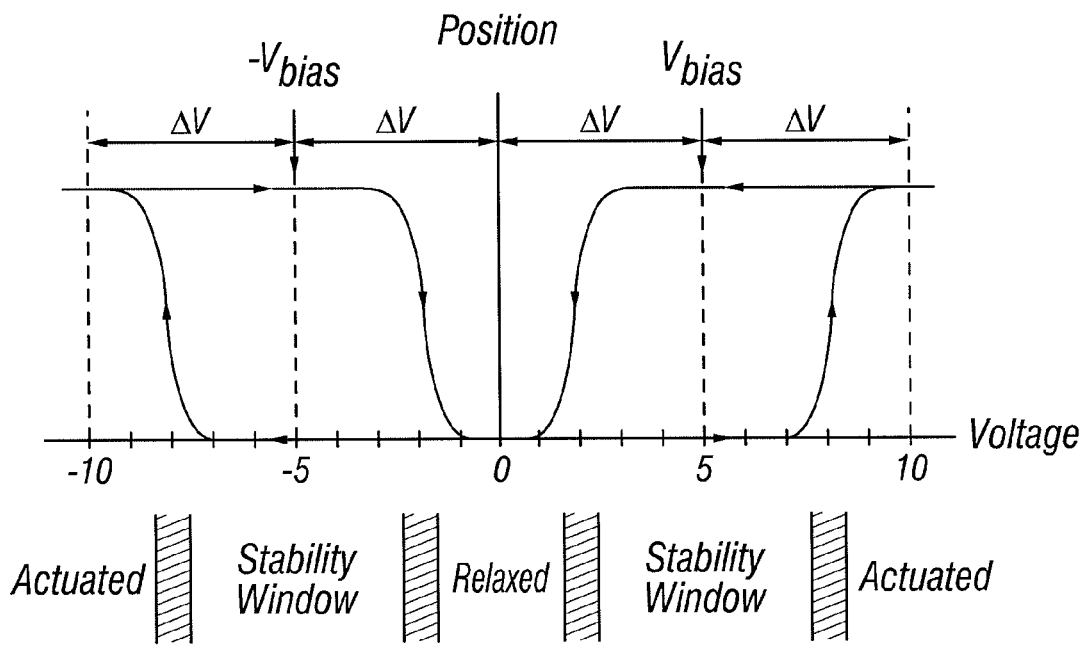
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
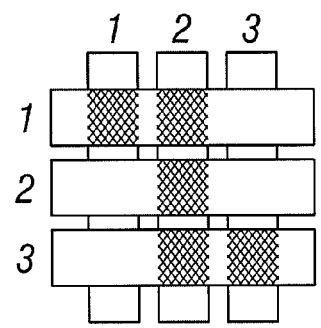
FIG. 5A illustrates one exemplary frame of display data in the 3×3 interferometric modulator display of FIG. 2.
Figure 5B:
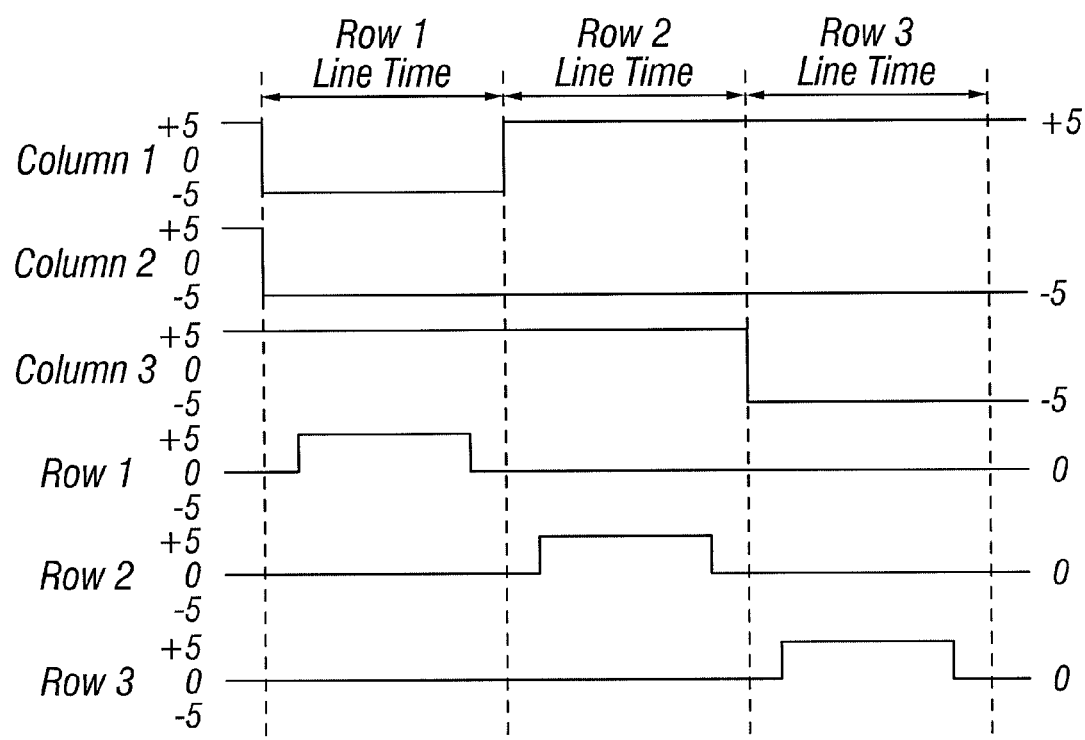
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
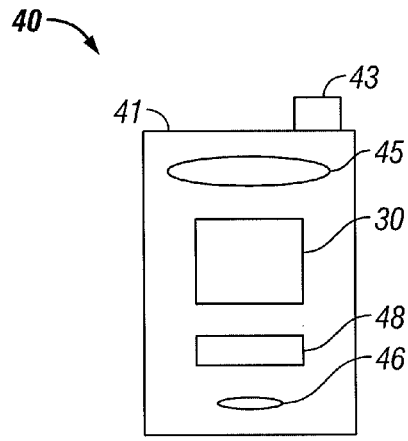
FIGS. 6A and 6B are system block diagrams illustrating an embodiment of a visual display device comprising a plurality of interferometric modulators.
Figure 6B:
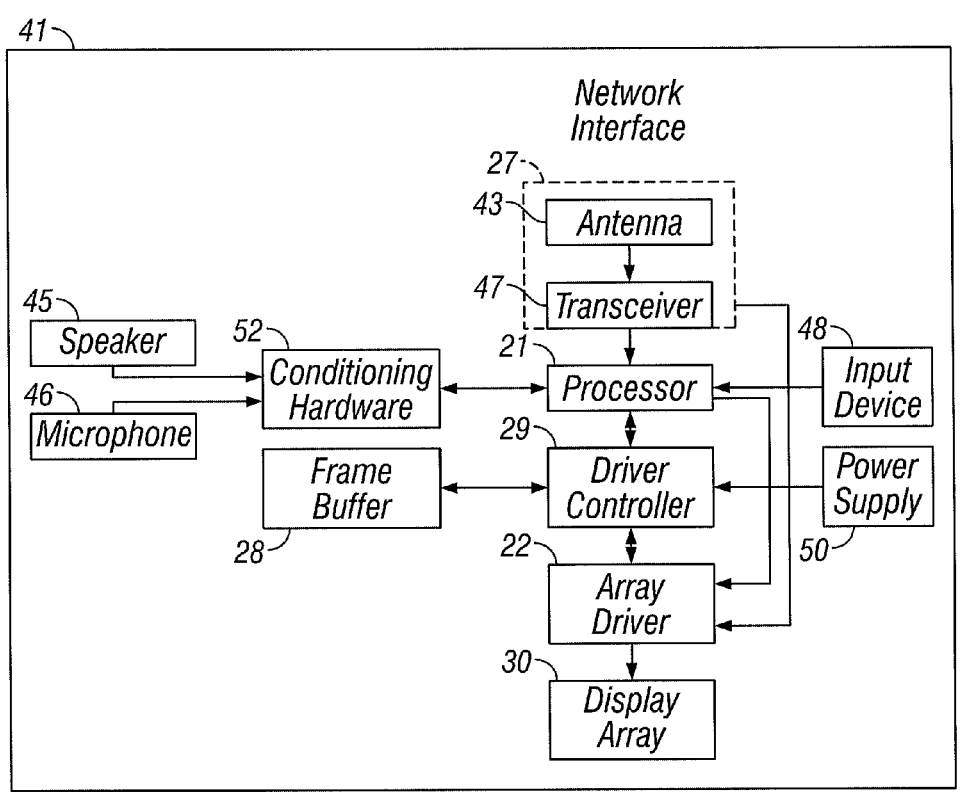

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
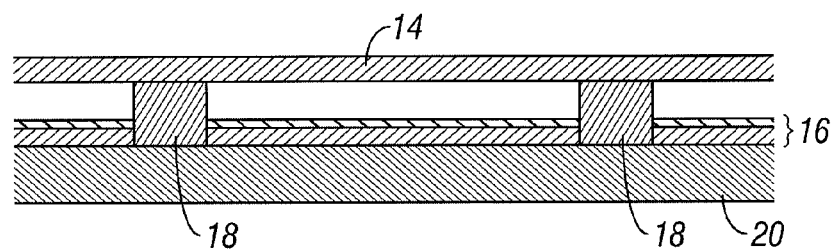
FIG. 7A is a cross section of the device of FIG. 1.
Figure 7B:
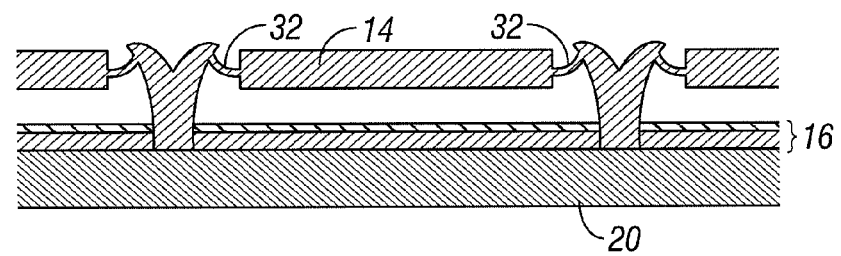
FIG. 7B is a cross section of an alternative embodiment of an interferometric modulator.
Figure 7C:
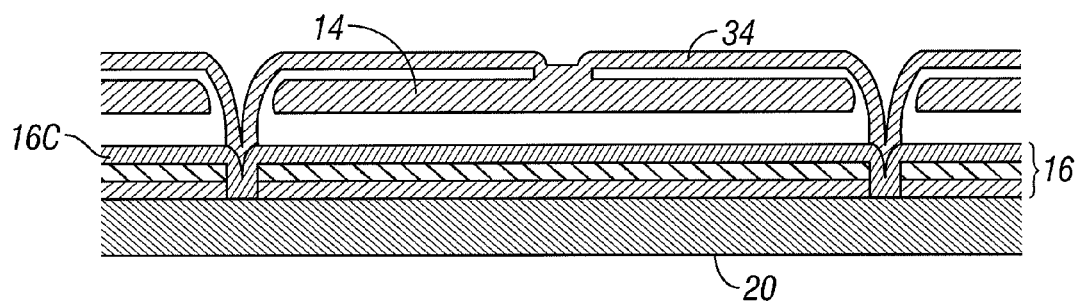
FIG. 7C is a cross section of another alternative embodiment of an interferometric modulator.
Figure 7D:
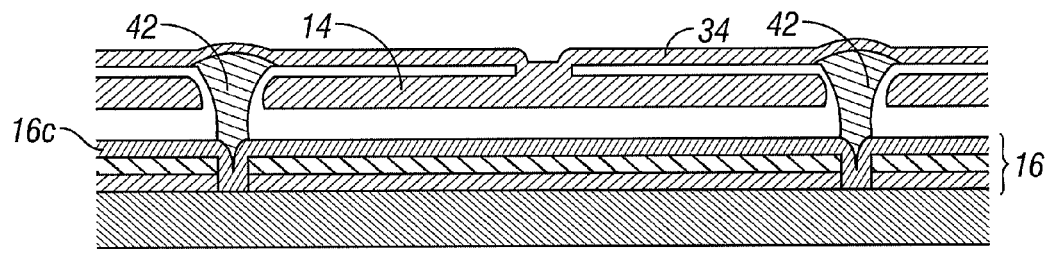
FIG. 7D is a cross section of yet another alternative embodiment of an interferometric modulator.
Figure 7E:
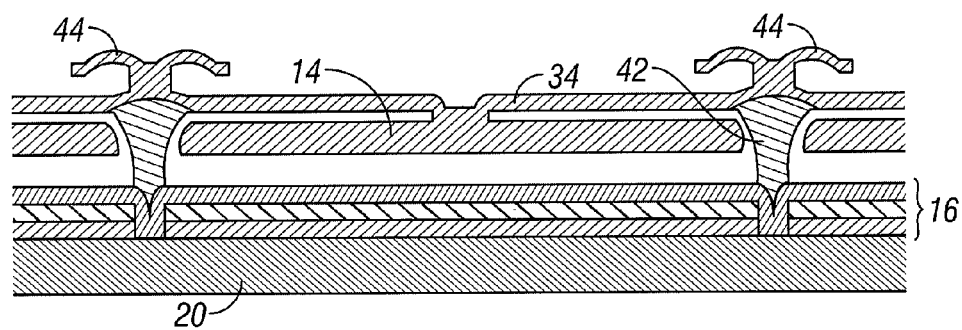
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Many such interferometric modulators are fabricated in an array on a substrate, and the array can suffer damage from electro-static discharge (ESD). The ESD damage to the array can happen at various stages of handling the array. For example, damage can occur during the manufacturing process of the array, during transportation, testing, and assembly of a device using the array. Damage can occur, for example, when the array is handled through human body contact, machine handling, or contact with a charged device. Typically, the source of the ESD event is hundreds or thousands of volts higher or lower than the device, and when the device and the source come into electrical contact, the potential difference between the source and the device is dissipated through a surge of electrical current. Components conducting the current are damaged if not designed to carry the high levels of current which occur. ESD events have various voltage, charge, and time characteristics, depending on stored charge and capacitance of the machine, person, or charged device sourcing the event, and on the resistance of the current path or paths of the event.

Figure 8:
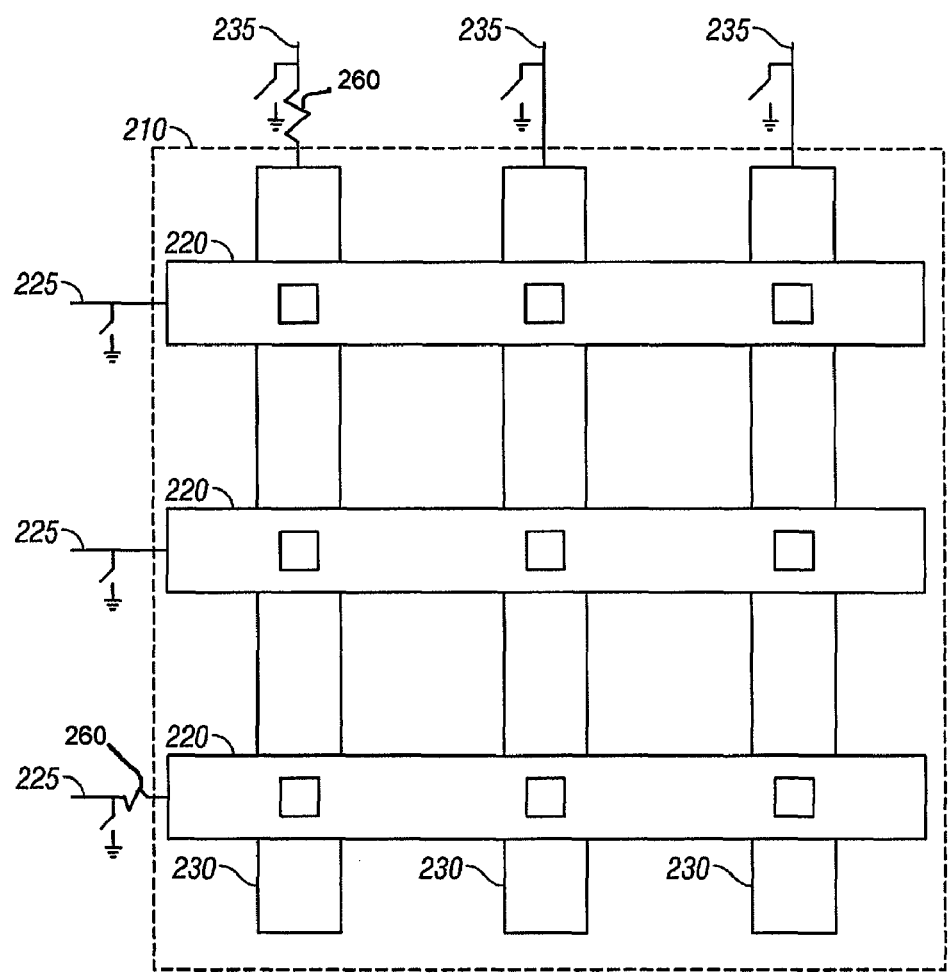
FIG. 8 is a schematic diagram showing an embodiment of an interferometric modulator array with protection switches.

Typically, addressing lines from individual array rows and columns are placed on a substrate. This allows each row and each column to be individually driven by the corresponding addressing lines during operation. FIG. 8 is a schematic view showing an array 210 with row addressing lines 220 connected to row ESD protection switches 225 and column addressing lines 230 connected to column ESD protection switches 235.

The row protection switches 225 and the column protection switches 235 are configured to protect the row and column electrodes of the array and their associated display elements, when an ESD event occurs. Such events may expose the display elements to a voltage of, for example, about 1 kV to 10 kV. During an ESD event, a high potential difference between the ESD source and a row or column electrode without a protection switch would cause a current to flow through the row or column electrode and through a path within the array which was not designed for carrying current. For example current may flow from the column electrode to a row electrode through a dielectric meant to electrically isolate the column and row electrodes. The current flowing through the dielectric may damage the dielectric. As explained further below, the large potential difference may be sensed by the row protection switches 225 or column protection switches 235. In response, the row protection switches 225 or column protection switches 235 close and provide an alternative path for the current. The alternative path is designed to carry the current, and may conduct the current to a ground potential or to another potential, such as a power potential or a reference potential. In some embodiments, the resistance of the ESD current carrying path is controlled with a resistor element 260 in the path, which may be formed with, for example, an ITO or ITO/Cr line. In some embodiments, the resistor element 260 may have a resistance of, for example about 10 k ohm, about 100 k ohm, or about 1M ohm. Other values can also be used. In some embodiments, resistors may be provided in the array path to be protected, to, for example, help ensure that the current takes the alternative path during the ESD event. Once the large potential difference is dissipated, the row protection switches 225 or column protection switches 235 return to an open state and the array can be driven using the row and column electrodes.

Figure 9A:
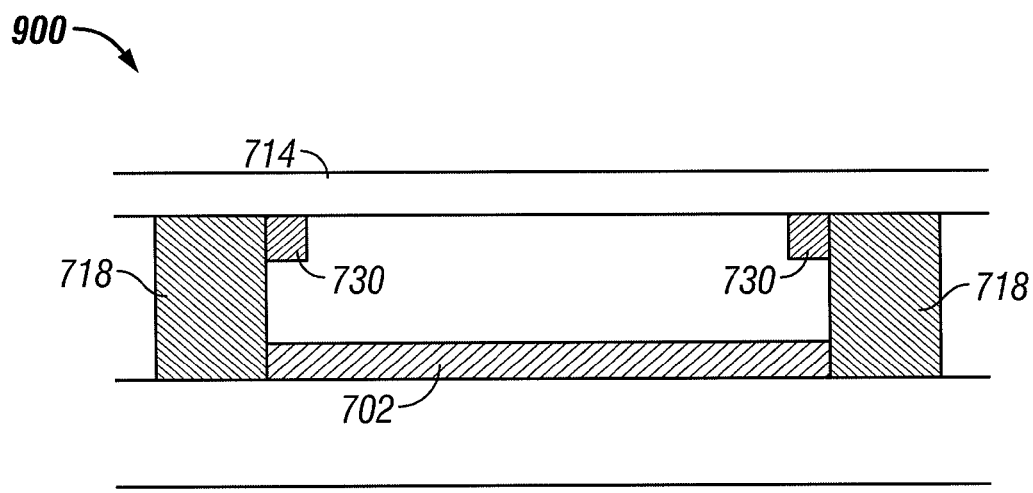
FIGS. 9A and 9B are cross-sectional and top views of an embodiment of a MEMS switch.
Figure 9B:
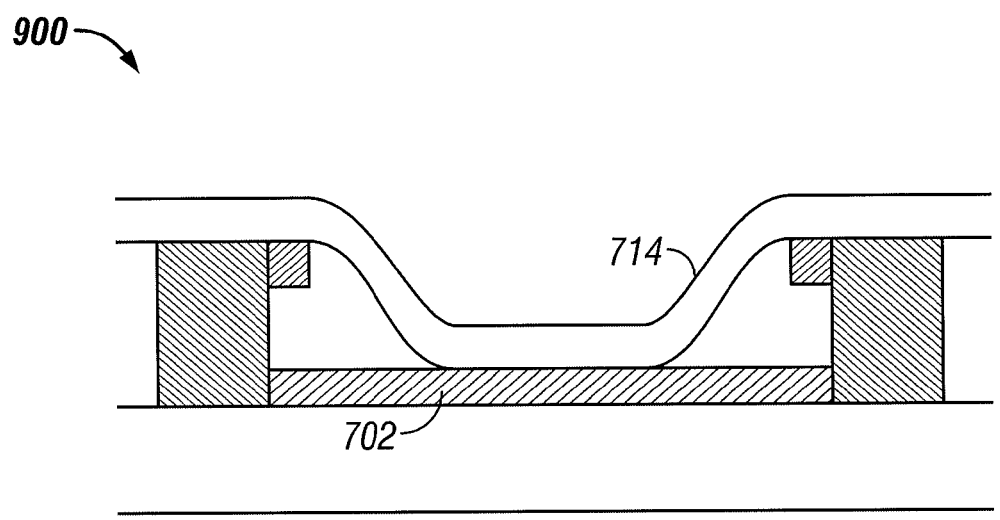

With some modifications, the basic structure of an interferometric modulator can be used as a MEMS switch to perform these switching functions of the row protection switches 225 and column protection switches 235. FIGS. 9A and 9B show a MEMS switch 900 configured to connect the moveable layer 714 to the lower electrode 702. As shown, the MEMS switch 900 of FIGS. 9A and 9B has similar collapsible cavity features as the interferometric modulator of FIG. 7A. Unlike the interferometric modulator of FIG. 7A, switch 900 does not have a dielectric layer preventing contact between the moveable layer 714 and the lower electrode 702 when the switch is actuated. As shown in FIG. 9B, when actuated, because the lower electrode 702 is not electrically isolated by the dielectric, the moveable layer contacts the lower electrode 702, and an electrical connection is established between the moveable layer 714 and the lower electrode 702.

The structure of switch 900 of FIGS. 9A and 9B can be used as row protection switches 225 or column protection switches 235 of FIG. 8. When used as protection switches, the charge of an ESD event is dissipated through the electrical connection between the movable layer and the lower electrode and to the ground, reference, or other potential.

Figure 10A:
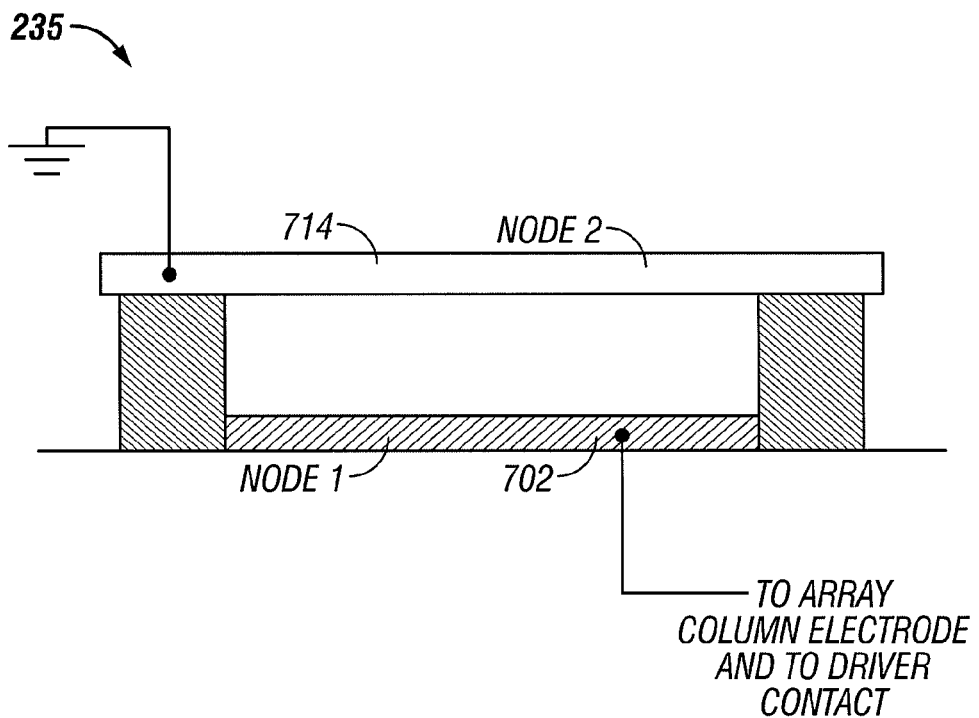
FIGS. 10A and 10B are a cross-sectional views of a MEMS switch used as a column protection switch.
Figure 10B:
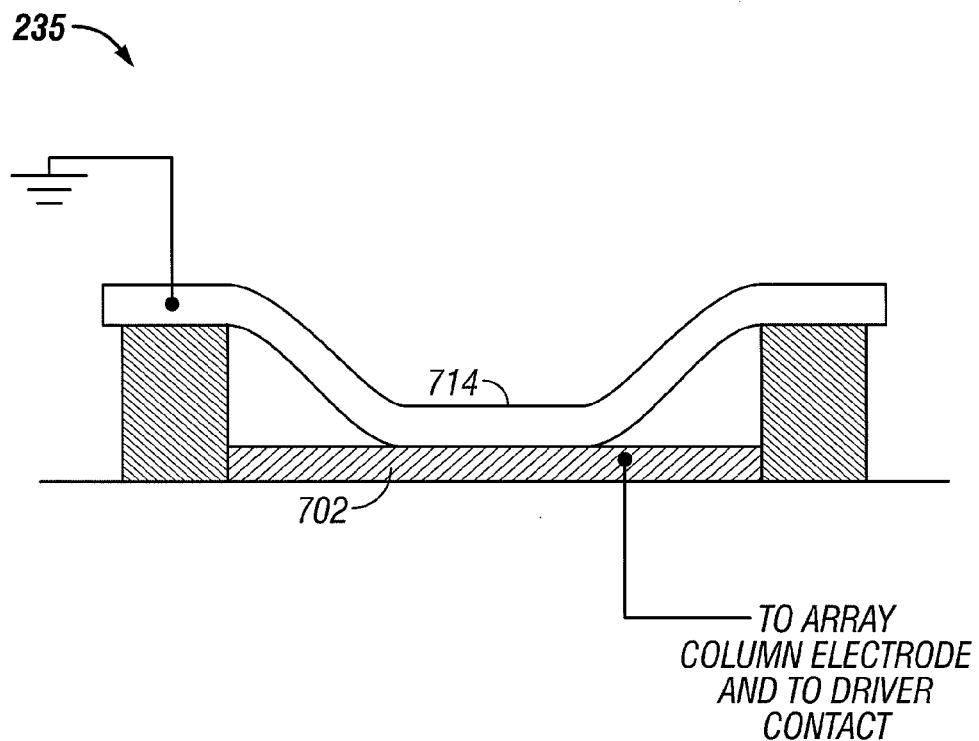

FIGS. 10A and 10B show switch 235 connected as a column protection switch 235 of FIG. 8. The lower electrode 702 is connected to node 1, which is a column electrode in FIG. 8, and the moveable layer 714 is connected to node 2, which is a ground potential in FIG. 8. The column electrode of FIG. 8 is also typically connected to a connection pad through which a driver circuit is connected to the column electrode. FIG. 10A shows switch 235 as configured for normal operation in the absence of an ESD event. The lower electrode 702 is used for addressing the interferometric modulator array as described above. The voltages used for the addressing operations do not cause a potential difference between the moveable layer 714 and the lower electrode 702 to be large enough to induce actuation of the switch 235. Accordingly, during normal operation the switch 235 remains unactuated, and the lower electrode 702 is electrically isolated from the ground potential of the moveable layer 714 by the height of the cavity between the lower electrode 702 and the moveable layer 714. During an ESD event occurring on the column electrode to which the lower electrode 702 is connected, a potential difference between the moveable layer 714 and the lower electrode 702 is large enough to actuate the switch 235. This condition is shown in FIG. 10B. As shown, the moveable layer 714 is in contact with the lower electrode 702. As described above, the ESD charge of the ESD event is dissipated through the switch connection to the ground potential to which the moveable layer 714 is connected. Once the ESD charge is dissipated, the potential difference between the moveable layer 714 and the lower electrode 702 is reduced so that the switch returns to the unactuated state, as shown in FIG. 10A.

Figure 11A:
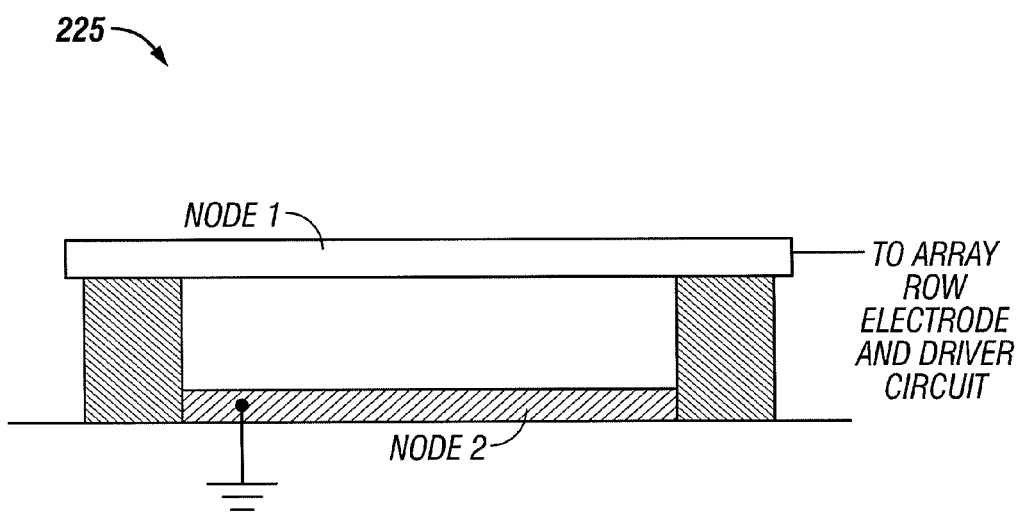
FIGS. 11A and 11B are a cross-sectional views of a MEMS switch used as a row protection switch.
Figure 11B:
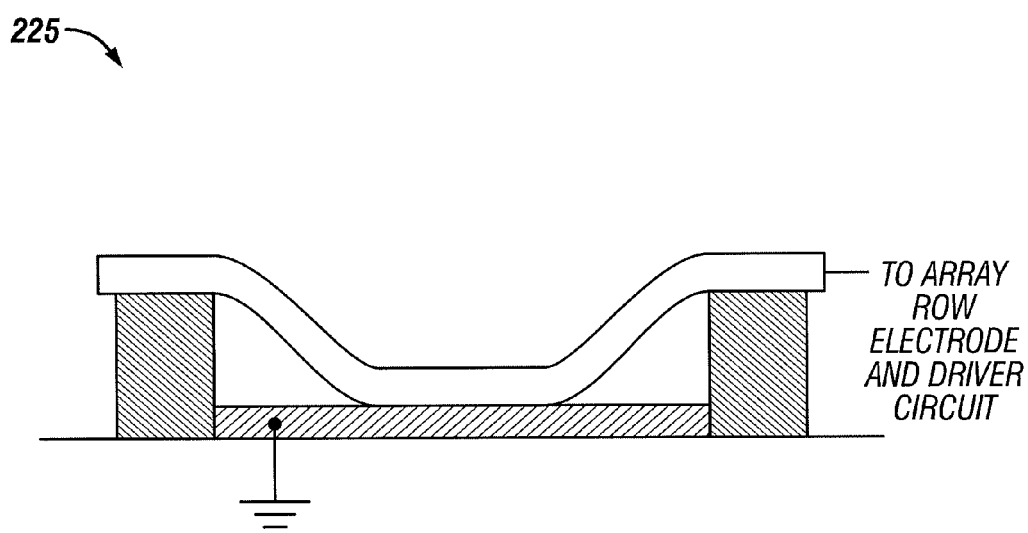

FIGS. 11A and 11B show switch 225 connected as a row protection switch 225 of FIG. 8. The moveable layer 714 is connected to node 1, which is a row electrode in FIG. 8, and the lower electrode 702 is connected to node 2, which is a ground potential in FIG. 8. The moveable layer 714 is also typically connected to a connection pad by which a driver circuit is connected to the row electrode. FIG. 11A shows switch 225 as configured for normal operation. The lower electrode 702 is used for addressing the interferometric modulator array as described above. The voltages used for the addressing operations do not cause a potential difference between the moveable layer 714 and the lower electrode 702 to be large enough to induce actuation of the switch 225. Accordingly, during normal operation the switch 225 remains unactuated, and the moveable layer 714 is electrically isolated from the ground potential of the lower electrode 702 by the height of the cavity between the lower electrode 702 and the moveable layer 714. During an ESD event occurring on the row electrode to which the moveable layer 714 is connected, a potential difference between the moveable layer 714 and the lower electrode 702 is large enough to actuate the switch 225. This condition is shown in FIG. 11B. As shown, the moveable layer 714 is in contact with the lower electrode 702. As described above, the ESD charge of the ESD event is dissipated through the switch connection to the ground potential to which the lower electrode 702 is connected. Once the ESD charge is dissipated, the potential difference between the moveable layer 714 and the lower electrode 702 is reduced so that the switch returns to the unactuated state, as shown in FIG. 11A.

Figure 12A:
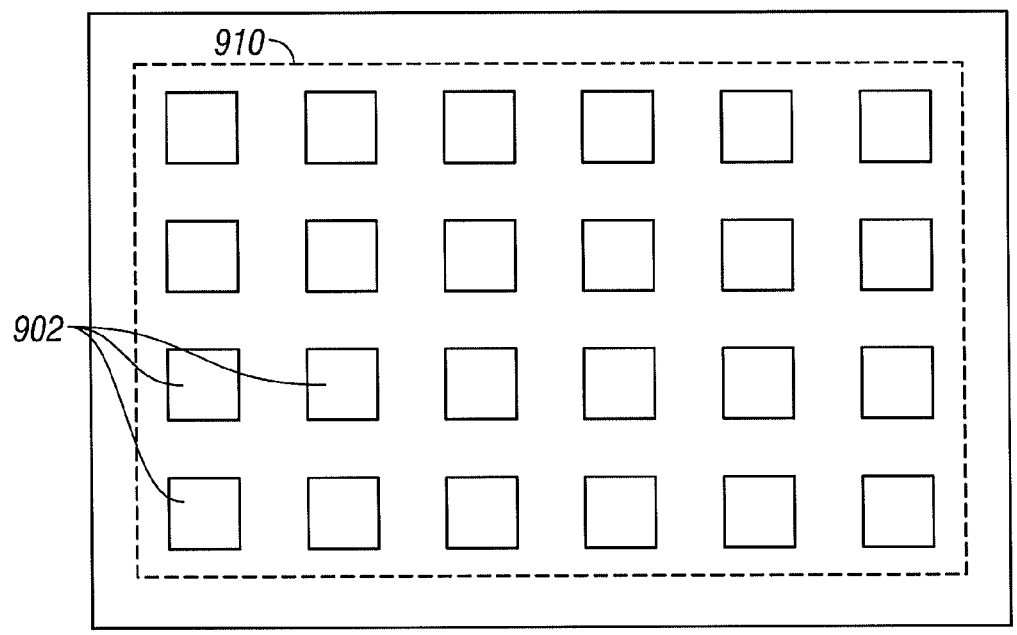
FIGS. 12A and 12B are schematic views of lower electrode arrangements for a MEMS switch.
Figure 12B:
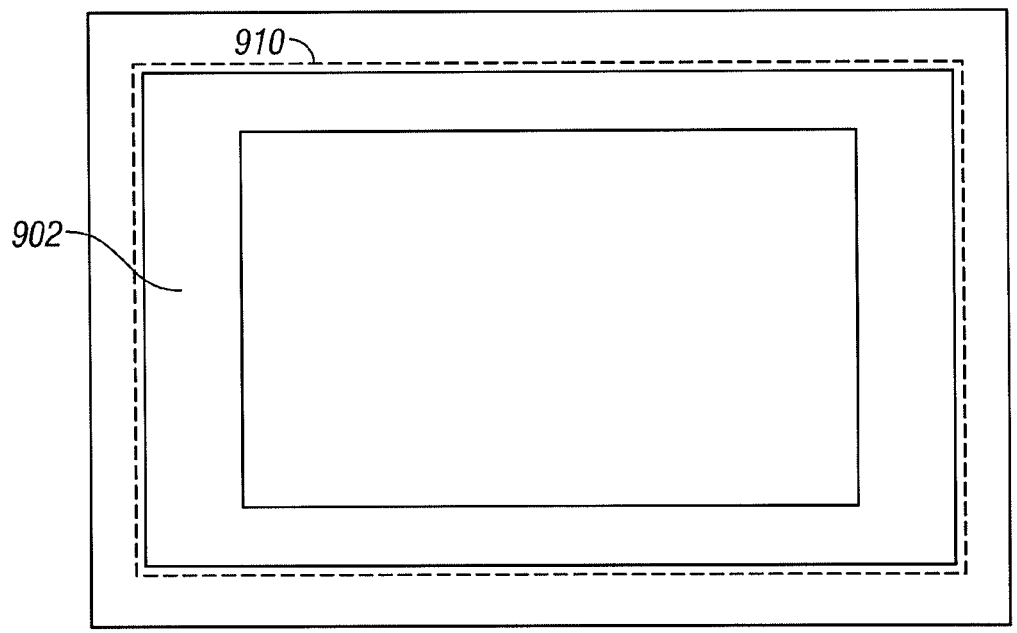

FIGS. 12A and 12B are top views of the lower electrode of some embodiments of MEMS switches. As shown, the exposed portions 902 of the lower electrode are not necessarily continuous across a single area within the total lower electrode area 910. In this embodiment, the lower electrode comprises an array of exposed portions 902 which are configured to contact the moveable layer when the potential difference between the lower layer and the moveable layer is greater than a threshold. Using this or a similar structure allows for management of such parameters as contact resistance, current density, and stiction. For example, the total contact area 910 of the lower electrode region may be determined to manage the shape of the moveable membrane while actuated, the current density of current flowing in the moveable membrane, and the movement of the moveable membrane during actuation. With the array structure, or another structure with only a portion of the electrode region used for contact between the moveable layer and the lower electrode, the area of the exposed portions 902 is determined separate from the total lower electrode area 910. Therefore, the current density and contact resistance in the lower electrode may be managed separately from other characteristics. For example, as in FIG. 12B, a central portion of the lower electrode area 910 may be covered with dielectric, and the exposed portion 902 may be in a peripheral region. This may have an advantageous characteristic that there is no connection or conductivity until the moveable layer is substantially fully actuated.

In order to allow for normal operation, the protection switches do not actuate when array control signals are driven onto the row and column electrodes. This occurs because the actuation threshold of the protection switches is higher than the actuation threshold of the array devices. Accordingly, the actuation threshold of the protection switches is higher than the voltages which the protection switches experience in normal operation. For example, if potential differences in normal operation are about 5 v, 10 v, or 20 v, the threshold for the protection switches may be about 10 v, 20 v, or 40 v, respectively. The 1:2 relationship between normal operation voltage and protection switch activation voltage is an example; other ratios are within the scope of the invention, for example 1:1.5, 1:2.8, 1.4:3, etc. The threshold voltage of the protection switches may be managed by various modifications to the switch structure. For example, the moveable layer may have more tensile stress than the corresponding moveable layers of the display array, or the posts of the switches may be closer to one another than the posts of the array interferometric modulators. Similarly, as seen in FIG. 9A, in some embodiments, the posts 718 may include overlap regions 730 to raise the threshold actuation voltage for the ESD protection devices.

MEMS switches built from the same basic structure as interferometric modulators ease the integration of ESD protection functions with interferometric modulator arrays. It is possible that other types of switches may be used to perform at least some of the above described functions, such as switches fabricated in a manner not similar to the fabrication of the interferometric elements, and more conventional electronic switches fabricated using thin silicon films deposited on the glass substrate. However, because fabrication of interferometric modulator based MEMS switches may be performed using many of the same processing steps that are used in fabricating interferometric modulators, these MEMS switches may be inexpensively integrated onto the same substrate as an array of interferometric modulators used, for example, for a display.

For example, in one embodiment the MEMS switches and interferometric modulators may be fabricated using a common fabrication process, although extra steps may be performed on the interferometric modulators and/or the MEMS switches during manufacture. For example, etching steps to remove the dielectric layer from the lower electrode are unnecessary for the fabrication of interferometric modulators. In such an embodiment some common steps would be performed, such as those for forming the lower electrodes, etc. Other MEMS switch specific or interferometric modulator specific steps could be performed. After these steps would follow more steps necessary for both the interferometric modulators and the MEMS switches, thus providing a combined interferometric modulator and MEMS switch array. An advantage of these embodiments is that the manufacturing process does not require significant modification as the MEMS switches comprise many of the same structures as the interferometric modulators.

Figure 13:
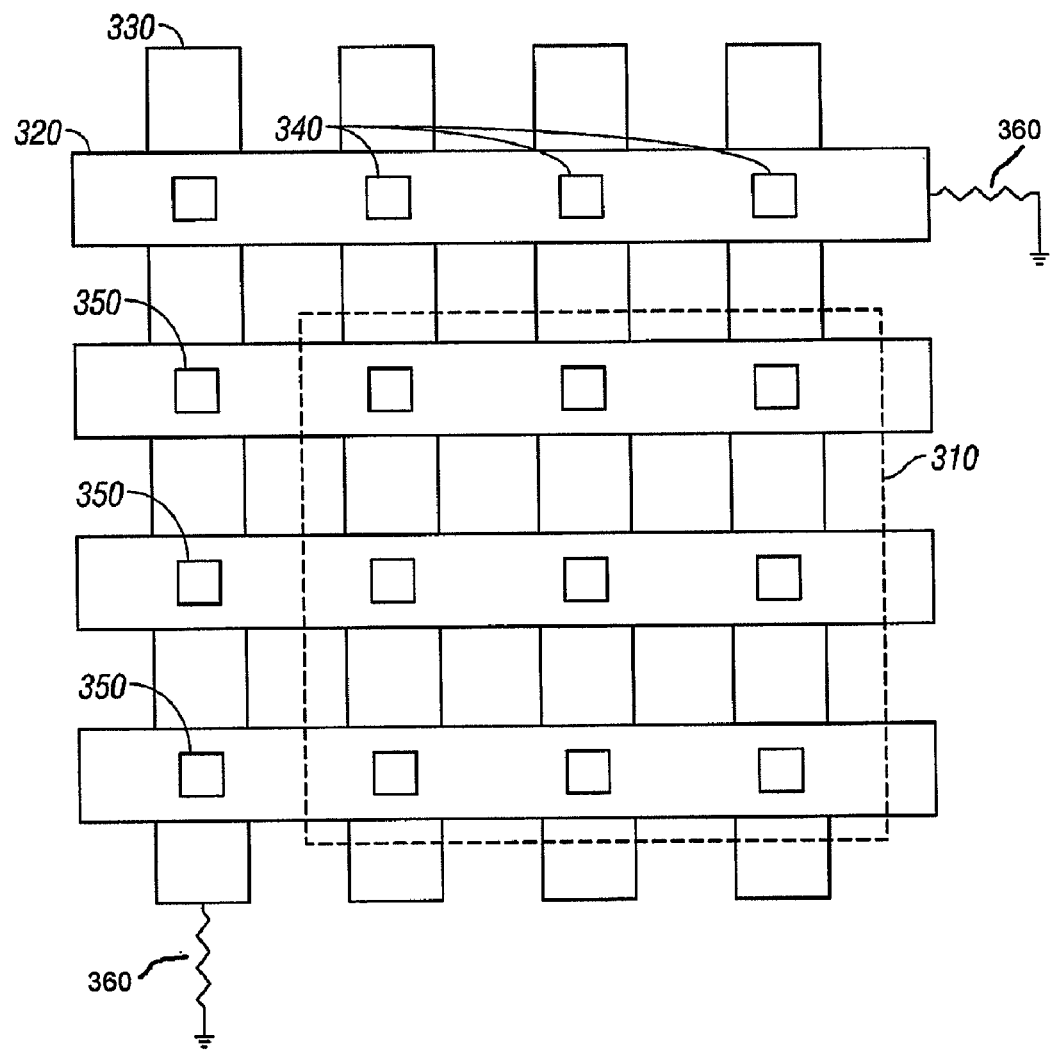
FIG. 13 is a schematic diagram showing an embodiment of an interferometric modulator array with protection switches.

FIG. 13 is a schematic view showing an embodiment with MEMS column switches 340 and row switches 350 built from the same basic structure as interferometric modulators of the array 310. In this embodiment, the switches each have a moveable layer and an at least partially exposed lower electrode. Accordingly, these switches have a structure similar to the structure of switch 900, shown in FIGS. 9A and 9B. The column switches 340 are arranged such that one column switch 340 is connected to each column of the interferometric modulator array 310. Each column switch 340 shares a common lower electrode with the interferometric modulators of the column to which the column switch 340 is connected. The column switches 340 are each configured to selectively connect a column of array 310 to column protection layer 320. Column protection layer 320 is connected to ground or another potential through a path, which may also include a resistor 360. Similarly, the row switches 350 are arranged such that one row switch 350 is connected to each row of the interferometric modulator array 310. Each row switch 350 shares a common moveable layer with the interferometric modulators of the row to which the row switch 350 is connected. The row switches 350 are configured to selectively connect a row of array 310 to row protection layer 330. Row protection layer 330 is connected to ground or another potential through a path, which may also include a resistor 360. Accordingly, when an ESD event occurs, the switches connected to the rows and columns affected by the event are actuated, as described above, the moveable layers electrically connect to the lower electrodes, and the ESD charge is dissipated to the ground or other potential through the switch. The embodiment of FIG. 13 shows the ease of integration of the MEMS switches 340 and 350 with the MEMS array 310.

In some embodiments, the bond pads for driver circuit connection are physically located on the electrical connection between the switch 340 or 350 and the row or column associated with the switch 340 or 350. Such a physical arrangement may allow for driver chips (not shown) to be placed near the array 310 over the protection switches. Accordingly, common substrate area is used for both the driver chip and the protection switches 340 and 350.

Figure 14:
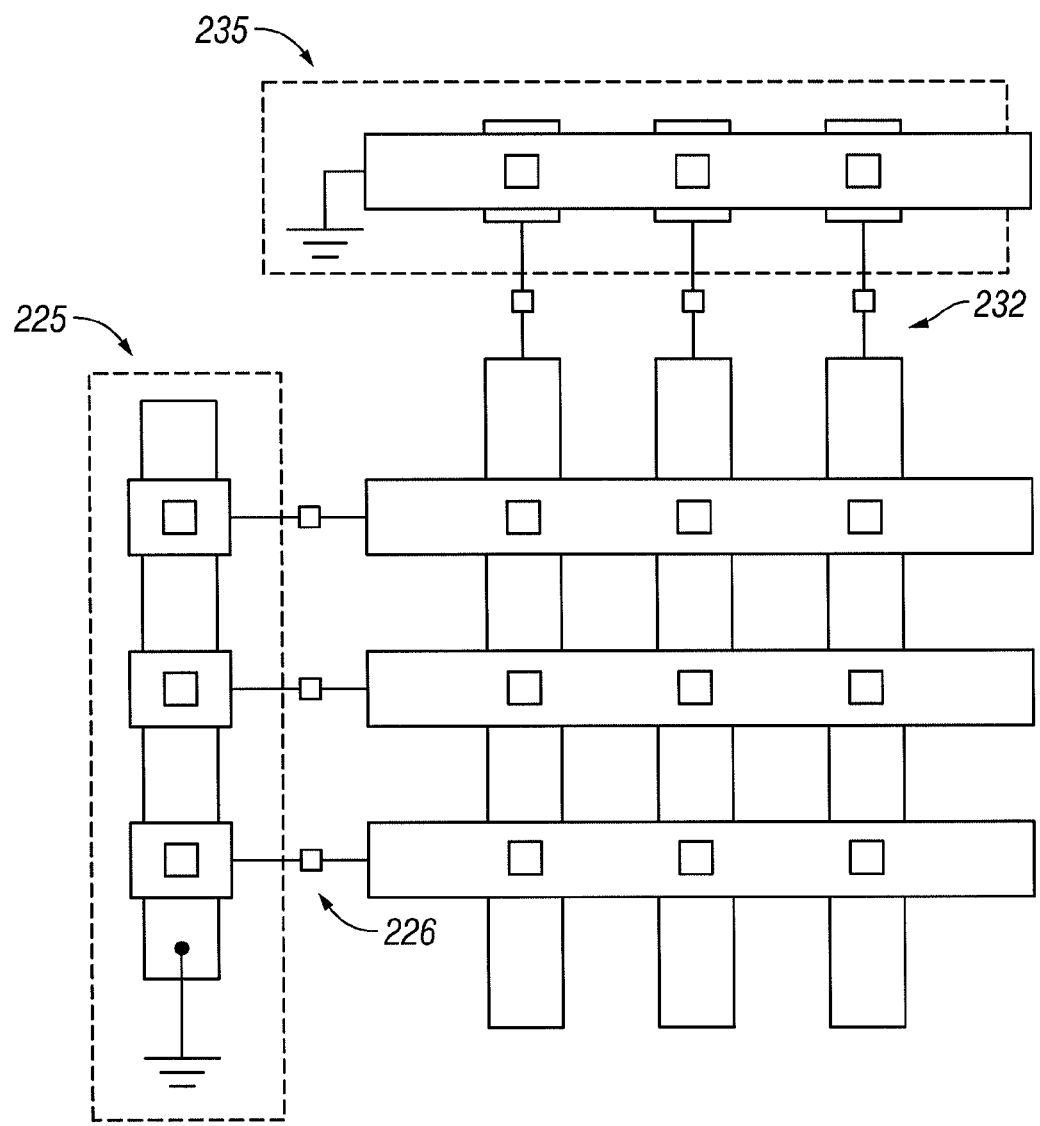
FIG. 14 is a schematic diagram showing another embodiment of an interferometric modulator array with protection switches.

FIG. 14 shows an embodiment with the row protection switches 225 and the column protection switches 235 placed in a location on the substrate which is to be later occupied by a driver circuit. For example, a row driver circuit (not shown) can be placed on the substrate so as to be over the row protection switches 225. As shown, between the row protection switches 225 and the array are located bond pads 226, which are configured to connect to terminals of the row driver circuit. Similarly, between the column protection switches 235 and the array are located bond pads 236, which are configured to connect to terminals of the column driver circuit. This arrangement is advantageous because the row protection switches 225 and column protection switches 235 may be located in an area of the substrate which serves an additional purpose. This efficiency provides for effective use of substrate area and a corresponding reduction in cost.

Figure 15A:
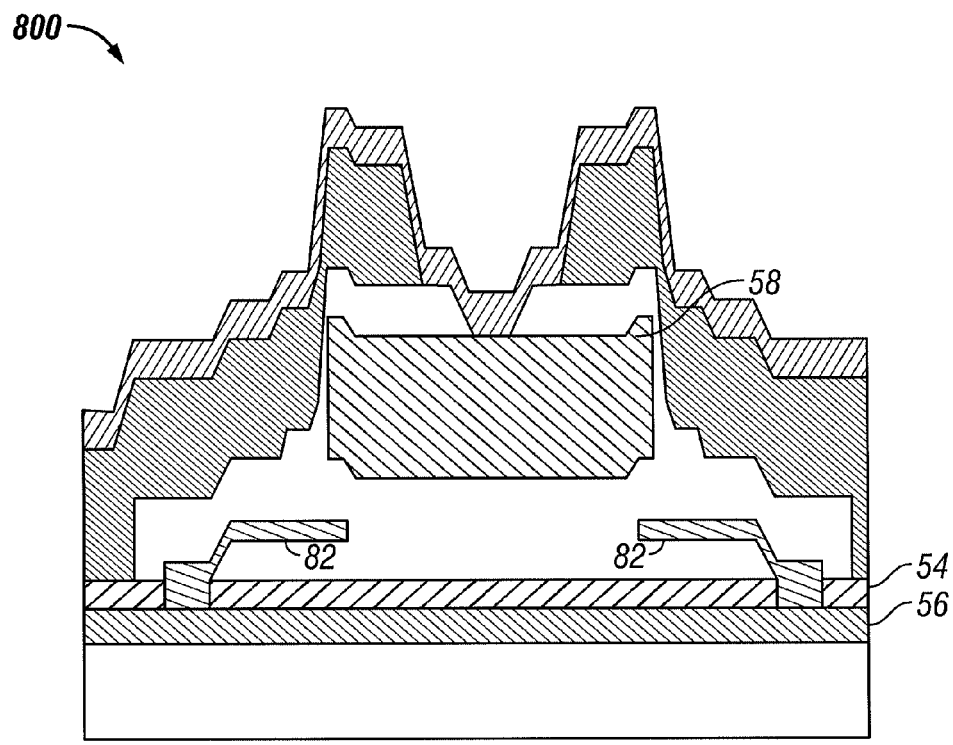
FIGS. 15A and 15B are cross-sectional and top views of an embodiment of a MEMS switch.
Figure 15B:
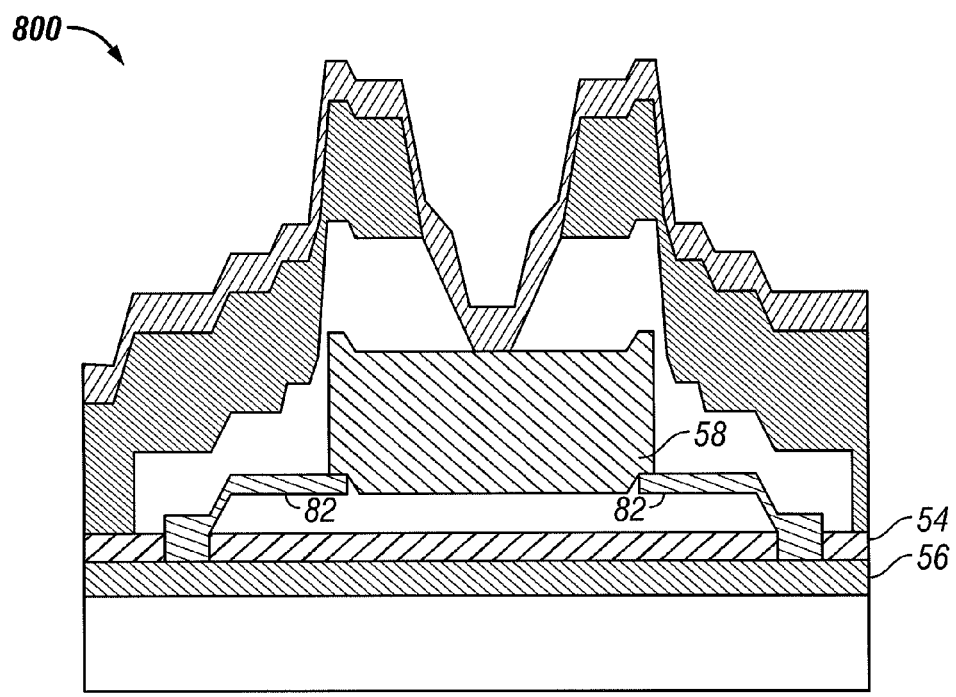

FIGS. 15A and 15B are cross-sectional side views of a MEMS switch 800 of another embodiment. In this embodiment, the terminals 82 are partially suspended over the surface of the dielectric 54. As in other switch designs switch 800 may be connected to the array with one of a variety of connection schemes. For example, the contact conductor 58 may be connected to the driver circuit and a column or a row electrode of the array, and the terminals 82 connected to the potential of the desired ESD current path (e.g. ground). Alternatively, the contact conductor 58 may be connected to the potential of the desired ESD current path, and the terminals 82 connected to the driver circuit and a column or a row electrode of the array. In some embodiments each of the terminals 82 may be connected to a different electrode, for example one may be connected to the potential of the desired ESD current path and the other connected to the driver circuit and a column or a row electrode of the array. This design has several advantages. First, because the terminals 82 are raised above the dielectric material, the bottom surface of the contact conductor 58 may be prevented from touching the dielectric 54 over lower terminal 56 when the switch is closed, as shown in FIG. 15B. This reduces the likelihood that the contact conductor 58 becomes stuck in the down position from adherence (or "stiction") between the dielectric and the contact conductor. Also, the terminals will act as microsprings and have some compliance in response to the contact force produced between the contact conductor 58 and the terminals 82 when the switch is closed. This allows some sliding action to occur at the interface (known as "contact swiping") which helps remove contaminants such as hydrocarbons that build up on hydrophobic surfaces, and reduce contact resistance. In addition, deformation of the microsprings when the switch is closed will store strain energy which is helpful in breaking the contact between the contact conductor 58 and the terminals 82 when the switch is opened by removing the actuating voltage from the device. This reduces instances of stiction between the contact conductor 58 and the terminals 82.

While the MEMS devices discussed above are interferometric modulators, other embodiments comprise other MEMS devices. In this application, use of the term 'MEMS' is for convenience and continuity and in no way limits the applicability of the invention to a certain size or range, whether for a device or feature size, or manufacturing tolerance. MEMS devices include those manufactured at macro and micro levels, regardless of what size or range language is commonly used, for example: meter, centimeter, millimeter, micrometer, nanometer, picometer, etc.

While the above detailed description has shown, described, and pointed out novel features as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A display device comprising:
a microelectromechanical system (MEMS) display portion comprising a plurality of MEMS display elements, each MEMS display element connected to at least one of a plurality of control inputs; and
a plurality of MEMS switches, each MEMS switch being configured to selectively connect at least one of the control inputs to a first potential in response to said control input reaching a second potential, wherein the MEMS display portion and the plurality of MEMS switches comprise a plurality of first and second layers, wherein each of the first layers forms a portion of one of the MEMS switches and a row or column of the MEMS display elements and each of the second layers forms a portion of one of the MEMS switches and a row or column of the MEMS display elements.

2. The device of claim 1, wherein the first potential is approximately equal to a ground potential.

3. The device of claim 1, wherein each MEMS switch is configured to selectively connect one or more of the MEMS display elements to the first potential through a resistor.

4. The device of claim 1, wherein each of the MEMS display elements is configured to actuate when a voltage with a magnitude higher than a first threshold is applied to the MEMS display element, wherein each of the MEMS switches is configured to actuate when a voltage with a magnitude higher than a second threshold is applied to the MEMS switch, and wherein the second threshold is higher than the first threshold.

5. The device of claim 1, wherein the MEMS display elements are formed in rows and columns, and the MEMS switches are formed as one or more additional rows or columns of MEMS switch elements adjacent to the MEMS display elements.

6. The device of claim 1, wherein each of the MEMS switches is configured to connect a component of the one or more of the MEMS display elements to ground when an electrostatic discharge (ESD) event occurs on the one or more control inputs.

7. The device of claim 1, wherein the MEMS switches each comprise first and second layers, wherein the first layer is configured to deform in response to a voltage across the first and second layers, and wherein the first and second layers are selectively connectable.

8. The device of claim 7, wherein the first and second layers are selectively electrically connected when the first layer is deformed.

9. The device of claim 8, each MEMS switch further comprising a dielectric layer between the first and second layers, the dielectric having one or more voids.

10. A display device comprising:
means for displaying an image, the displaying means comprising a plurality of display elements, each display element connected to at least one of a plurality of control inputs; and
a plurality of means for selectively connecting at least one of the control inputs to a first potential in response to said control input reaching a second potential, wherein the displaying means and the connecting means comprise a plurality of first and second layers, wherein each of the first layers forms a portion of one of the connecting means and a row or column of the displaying means and each of the second layers forms a portion of one of the connecting means and a row or column of the displaying means.

11. The device of claim 10, wherein the first potential is approximately a ground potential.

12. The device of claim 10, wherein each connecting means is configured to selectively connect one or more of the MEMS display elements to the first potential through a resistor.

13. The device of claim 10, wherein each of the display elements is configured to actuate when a voltage with a magnitude higher than a first threshold is applied to the display element, wherein each of the connecting means is configured to connect one or more of the MEMS display elements to the first potential when a voltage with a magnitude higher than a second threshold is applied to the connecting means, and wherein the second threshold is higher than the first threshold.

14. The device of claim 10, wherein each of the connecting means is configured to connect a component of the one or more of the display elements to ground when an ESD event occurs on the one or more control inputs.

15. A method of connecting one or more row or column electrodes of an array to a first potential, the method comprising closing a MEMS switch in response to a voltage exceeding a threshold voltage on the row or column electrode, wherein the row or column electrode is connected to the first potential, and wherein the row and column electrodes and MEMS switch comprise first and second layers, the first layer forming a portion of the MEMS switch and a row or column electrode and the second layer forming a portion of the MEMS switch and a row or column electrode.

16. The method of claim 15, wherein the voltage is generated as the result of an ESD event.

17. The method of claim 15, wherein the first potential is approximately at a ground potential.

18. The method of claim 15, wherein the MEMS switch is configured to sense the voltage.

19. The method of claim 15, further comprising opening the MEMS switch to disconnect the row or column electrode from the first potential.

20. A display device comprising:
a display comprising a plurality of MEMS display elements comprising a plurality of first and second layers, each MEMS display element connected to one of a plurality of row electrodes and one of a plurality of column electrodes;
a plurality of MEMS switches, each MEMS switch formed of a portion of the first and second layers and connected to a first potential and to a row electrode or a column electrode, wherein each MEMS switch is configured to connect the first potential to the row or column electrode when a voltage on the row or column electrode exceeds a first threshold.

21. The device of claim 20, wherein the MEMS display elements are configured to actuate when an applied voltage exceeds a second threshold, the first threshold being greater than the second threshold.

22. A display device comprising:
a MEMS display portion comprising a plurality of MEMS display elements, each MEMS display element having a first actuation threshold;
a plurality of MEMS switches connected to the display portion, each MEMS switch having a second actuation threshold, wherein the second actuation threshold is higher than the first actuation threshold, wherein the MEMS display portion and the plurality of MEMS switches comprise a plurality of first and second layers, wherein each of the first layers forms a portion of one of the MEMS switches and a row or column of the MEMS display elements and each of the second layers forms a portion of one of the MEMS switches and a row or column of the MEMS display elements.

23. The device of claim 22, wherein the first potential is approximately equal to a ground potential.

24. The device of claim 22, wherein each MEMS switch is configured to selectively connect one or more of the MEMS display elements to the first potential through a resistor.

25. The device of claim 22, wherein the MEMS display elements are formed in rows and columns, and the MEMS switches are formed as one or more additional rows or columns of MEMS switch elements adjacent to the MEMS display elements.

26. The device of claim 22, wherein each of the MEMS switches is configured to connect a component of the one or more of the MEMS display elements to ground when an ESD event occurs on the one or more control inputs.

27. The device of claim 22, wherein the MEMS switches each comprise first and second layers, wherein the first layer is configured to deform in response to a voltage across the first and second layers, and wherein the first and second layers are selectively connectable.

28. The device of claim 27, wherein the first and second layers are selectively electrically connected when the first layer is deformed.

29. The device of claim 28, each MEMS switch further comprising a dielectric layer between the first and second layers, the dielectric having one or more voids.

30. A display device comprising:
 means for displaying comprising a plurality of display elements, each display element having a first actuation threshold; and
 means for selectively connecting the displaying means to one or more electrodes, the connecting means comprising a plurality of connecting elements, each connecting element having a second actuation threshold, wherein the second actuation threshold is higher than the first actuation threshold, wherein the displaying means and the connecting means comprise a plurality of first and second layers, wherein each of the first layers forms a portion of one of the connecting means and a row or column of the displaying means and each of the second layers forms a portion of one of the connecting means and a row or column of the displaying means.

31. The device of claim 30, wherein the one or more electrodes are connected to an electrical potential approximately equal to a ground potential.

32. The device of claim 30, wherein each connecting element is configured to selectively connect one or more of the display elements to the one or more electrodes through a resistor.

33. The device of claim 30, wherein the display elements are formed in rows and columns, and the connecting elements are formed as one or more additional rows or columns of connecting elements adjacent to the display elements.

34. The device of claim 30, wherein each of the connecting elements is configured to connect a component of the plurality of the display elements to ground when an ESD event occurs on the device.

35. The device of claim 30, wherein the connecting elements each comprise first and second layers, wherein the first layer is configured to deform in response to a voltage across the first and second layers, and wherein the first and second layers are selectively connectable.

36. The device of claim 35, wherein the first and second layers are selectively electrically connected when the first layer is deformed.

37. The device of claim 36, each connecting element further comprising a dielectric layer between the first and second layers, the dielectric having one or more voids.

38. A method of manufacturing a display device, the method comprising:
 forming a MEMS display portion comprising a plurality of MEMS display elements, each MEMS display element having a first actuation threshold; and
 forming a plurality of MEMS switches connected to the display portion, each MEMS switch having a second actuation threshold, wherein the second actuation threshold is higher than the first actuation threshold, wherein forming the display portion and the MEMS switches comprises forming a plurality of first and second layers, wherein each of the first layers forms a portion of one of the MEMS switches and a row or column of the MEMS display elements and each of the second layers forms a portion of one of the MEMS switches and a row or column of the MEMS display elements.

39. The method of claim 38, wherein each MEMS switch is configured to selectively connect one or more of the MEMS display elements to the first potential through a resistor.

40. The method of claim 38, wherein the first potential is approximately equal to a ground potential.

41. The method of any of claims 38, wherein each of the MEMS switches is configured to connect a component of the one or more of the MEMS display elements to ground when an ESD event occurs on the one or more control inputs.

42. The method of any of claims 38, wherein the first and second layers are selectively electrically connected when the first layer is deformed.

* * * * *

UNITED STATES PATENT AND TRADEMARK OFFICE
CERTIFICATE OF CORRECTION

| | |
|---|---|
| PATENT NO. | : 8,022,896 B2 |
| APPLICATION NO. | : 11/836045 |
| DATED | : September 20, 2011 |
| INVENTOR(S) | : Je-Hsiung Lan et al. |

Page 1 of 1

It is certified that error appears in the above-identified patent and that said Letters Patent is hereby corrected as shown below:

At column 1, line 10, please replace "and or" with -- and/or --.

At column 1, line 37, please replace "and or" with -- and/or --.

At column 18, line 38, in Claim 41, please replace "any of claims" to -- claim --.

At column 18, line 42, in Claim 42, please replace "any of claims" to -- claim --.

Signed and Sealed this
Seventeenth Day of April, 2012

David J. Kappos
*Director of the United States Patent and Trademark Office*